United States Patent [19]
Lindberg et al.

[11] Patent Number: 5,428,320
[45] Date of Patent: Jun. 27, 1995

[54] BIPHASE MODULATOR AND METHOD WITHOUT MATCHING ELEMENTS

[75] Inventors: Craig E. Lindberg, Chandler; Michael Dydyk, Scottsdale, both of Ariz.

[73] Assignee: Motorola, Inc., Schaumburg, Ill.

[21] Appl. No.: 297,081

[22] Filed: Aug. 29, 1994

[51] Int. Cl.⁶ ............................................. H04L 27/20
[52] U.S. Cl. .................................. 332/105; 375/282; 375/308
[58] Field of Search ........................ 332/103, 104, 105; 375/52, 55, 67

[56] References Cited

U.S. PATENT DOCUMENTS

| | | | |
|---|---|---|---|
| 4,276,521 | 6/1981 | Davidheiser | 332/23 R |
| 4,355,289 | 10/1982 | Beyer et al. | 332/17 |
| 4,471,330 | 9/1984 | Naster et al. | 333/164 |
| 4,638,190 | 1/1987 | Hwang et al. | 307/512 |
| 5,081,432 | 1/1992 | Devlin et al. | 332/103 |
| 5,166,648 | 11/1992 | Wen et al. | 333/139 |

*Primary Examiner*—Siegfried H. Grimm
*Attorney, Agent, or Firm*—Jeffrey D. Nehr

[57] ABSTRACT

A biphase modulator without matching elements includes a Lange coupler (5) including first, second, third, and fourth ports (1,2, 3, 4), where the first port (1) receives a RF input signal. FETs (6, 7) each have a source, gate, and drain (19, 17, 18 and 22, 20, 21). The drain (18) of the first FET (6) is coupled to the second port (2), the source (19) of the first FET (6) and the second FET (7) are coupled to electrical ground, and the drain (21) of the second FET (7) is coupled to the fourth port (4). The FETs, are switched at the desired modulation frequency by a control input (16) to the gates (17, 20), alternately providing a zero volt signal and a pinch-off voltage signal which produces a biphase modulated RF input signal at the third port (3) of the Lange coupler (5).

18 Claims, 2 Drawing Sheets

BIPHASE MODULATOR AND METHOD WITHOUT MATCHING ELEMENTS

FIELD OF THE INVENTION

This invention relates in general to biphase modulator and methods and in particular to biphase modulator and method without matching elements.

BACKGROUND OF THE INVENTION

Biphase modulator designs utilize field effect transistors (FETs) or PIN diodes as switches and are controlled at the modulation rate to give two phase conditions, 0 degrees and 180 degrees. Since both types of devices have complex impedance in the two states, matching elements are used to resonate out these parasitics. It is difficult, however, to achieve resonance in one state without effecting the resonance of the other. Consequently, the design can only approach 0 and 180 degree phase. Additional elements are often required to achieve amplitude balance, which results in increased size of the biphase modulator and insertion loss.

Next generation defense systems will be much more sophisticated and require substantially improved sensitivity. To accomplish this, it will be necessary to have a biphase modulator and method with broad bandwidth, amplitude balance, low insertion loss, and which results in a very small device. The biphase modulator and method should be cost effective. It would be desirable if a biphase modulator and method could be accomplished without the use of matching elements.

DETAILED DESCRIPTION OF THE DRAWINGS

While the biphase modulator and method without matching elements discussed is particularly suited for the application described below, other applications will be readily apparent to those of skill in the art.

Figure 1:
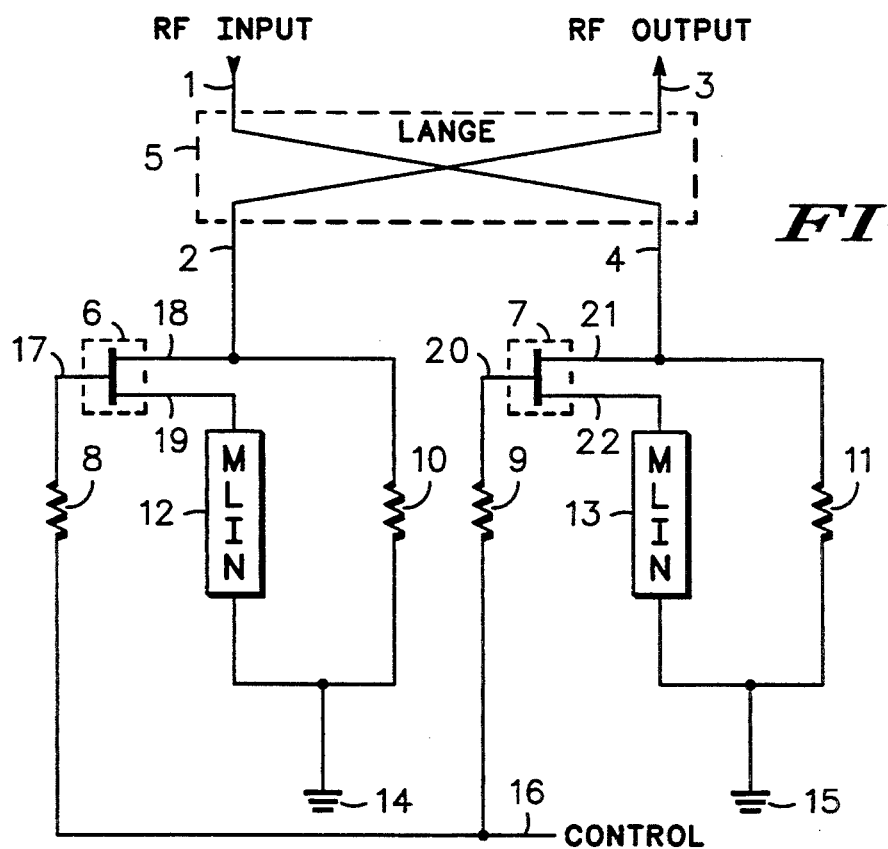
In FIG. 1, there is shown a basic schematic diagram of a biphase modulator in accordance with a preferred embodiment of the invention.

The present invention can be more fully understood with reference to the figures. FIG. 1 illustrates schematically a bi-phase modulator in accordance with a preferred embodiment of the invention. The major components include the Lange coupler 5, and two 1.0 μm MESFETs 6 and 7. The drains 18 and 21 of the FETs 6 and 7 are connected to the through ports 2 and 4, respectively, of the Lange coupler 5. The gates 17 and 20 of the FETs 6 and 7 are connected to the control input 16 through gate bias resistors 8 and 9, respectively. The sources 19 and 22 of the two FETs 6 and 7 are connected to ground 14 and 15 through two sections of microstrip line 12 and 13, respectively. The drains 18 and 21 of the FETs 6 and 7 are connected to ground with drain resistors 10 and 11. The RF input 1 of the bi-phase modulator is at the input port of the Lange coupler 5, and the RF output 3 is at the isolated port.

The modulation of the RF output signal 3, between 0 and 180 degrees, is achieved by switching the two FETs 6 and 7 on and off at the desired frequency of modulation. With $V_{ds}=0$ volts, the on and off states of the FETs 6 and 7 are when the control line 16 voltage is at 0 volts and at Vp, the pinch-off voltage of the FET 6 and 7, respectively. In a typical implementation, the through ports 2 and 4 of the coupler see either a pure open or short circuit at the drains 18 and 21 of the FETs 6 and 7, thus causing the modulation of the RF output 3 phase between 0 and 180 degrees. Complete symmetry at the two loaded ports 2 and 4 of the Lange coupler 5 assures that changes in the reflection coefficients between the two states are identical at each port. However, a disadvantage of such an approach is that additional matching elements are needed in order to resonate out the parasitics and achieve the desired 0 and 180 degrees phase angles, due to the fact that the FETs 6 and 7 have complex impedances in both states. It is difficult to achieve resonance in one state without affecting the resonance of the other.

In the preferred embodiment of this invention, symmetry is not a concern and specific 0 and 180 degrees reflection coefficients on the through ports 2 and 4 of the coupler 5 are not required. The differential phase requirement at the RF output 3 is achieved by the proper selection of gate length and width for the FETs 6 and 7 and by adjusting the microstrip line 12 and 13 lengths that connect the sources 19 and 22 of the FETs 6 and 7 to ground 14 and 15. Other than the gate bias resistors 8 and 9, the only additional elements needed are the drain resistors 10 and 11, which can be adjusted to give amplitude balance.

The result that specific reflection coefficients at the through ports 2 and 4 of the Lange coupler 5 are not required and need not be identical to each other, can be shown using the transfer function matrix of an ideal Lange coupler:

$$\begin{pmatrix} b_1 \\ b_2 \\ b_3 \\ b_4 \end{pmatrix} = k \begin{pmatrix} 0 & 1 & 0 & j \\ 1 & 0 & j & 0 \\ 0 & j & 0 & 1 \\ j & 0 & 1 & 0 \end{pmatrix} \begin{pmatrix} a_1 \\ b_2 \Gamma_2 \\ 0 \\ b_4 \Gamma_4 \end{pmatrix} \quad (1)$$

$\tau_2$ and $\tau_4$ are the reflection coefficients seen by a Lange coupler 5 at the through ports 2 and 4, and k is the coupling coefficient of the coupler 5. The expressions for the outputs at the through ports 2 and 4 and the isolated port or RF output 3 of the coupler are as follows, assuming the standard $$b_2 = \frac{a_1}{\sqrt{2}} \quad (2)$$

$$b_4 = \frac{ja_1}{\sqrt{2}} \quad (3)$$

$$b_3 = \frac{1}{\sqrt{2}} (jb_2\Gamma_2 + b_4\Gamma_4) \quad (4)$$

Solving for $b_3$ in terms of $a_1$:

$$b_3 = \frac{ja_1}{2} (\Gamma_2 + \Gamma_4) \quad (5)$$

Using this relationship, the phase change through the coupler 5 (RF input 1 to RF output 3) can be calculated by vector adding the reflection coefficients at the through ports 2 and 4 of the coupler 5. This relationship can be rewritten for both the on and off states of the FETs 6 and 7, and their ratio can be taken to evaluate the differences between the two states of the modulator. The resulting expression is shown below:

$$\frac{b_{3off}}{b_{3on}} = \frac{(\Gamma_{2off} + \Gamma_{4off})}{(\Gamma_{2on} + \Gamma_{4on})} \quad (6)$$

For the perfect bi-phase modulator, the magnitude of equation (6) should be 1.0, thus meaning identical insertion losses in the two states and perfect amplitude balance. The angle of equation (6) should be equal to 180 degrees.

With this type of design approach, the selection of the FET 6 and 7 gate widths becomes the most important factor in achieving the desired phase modulation. The method is to first ground the source 19 or 22 of a FET 6 or 7, respectively, and define it as a 1 port network looking into the drain 18 or 21. The gate length and width is then chosen such that, at the RF frequency of interest, there is greater than a 180 degrees shift of S11 at the drain 18 or 21, respectively. An added degree of freedom in accomplishing this phase delta is a length of transmission line 12 and 13 connecting the source 19 and 22 of FETs 6 and 7 to ground 14 and 15, respectively. Adjusting microstrip line 12 or 13 length will only significantly affect the input phase of the FET 6 or 7, respectively, in the on state, moving it closer to that of the off state. Although larger periphery FETs 6 and 7 have less insertion loss, they also have bigger phase differences between the two states. Consequently, longer microstrip line 12 and 13 lengths are needed when grounding the source 19 and 22 of FETs 6 and 7. Conversely, if the FET 6 and 7 is too small, even with a pure short located right at the source 19 and 22, a 180 degrees phase difference between the two states may not be achievable.

Amplitude balance of the modulator is accomplished by the selection of the drain resistors 10 and 11 on the FETs 6 and 7. Since the FETs 6 and 7 are being used as switches, resistors 10 and 11 are inherently needed to provide a DC path to ground 14 and 15 on the drains 18 and 21 of the FETs 6 and 7, respectively, making $V_{ds}=0$ volts, and are typically very large in value in order to prevent unnecessary loss. Since the insertion loss of the modulator is larger when FETs 6 and 7 are in the on state, the value of these resistors 10 and 11 is reduced so that the loss in the off state will increase to match that of the on state.

Figure 2:
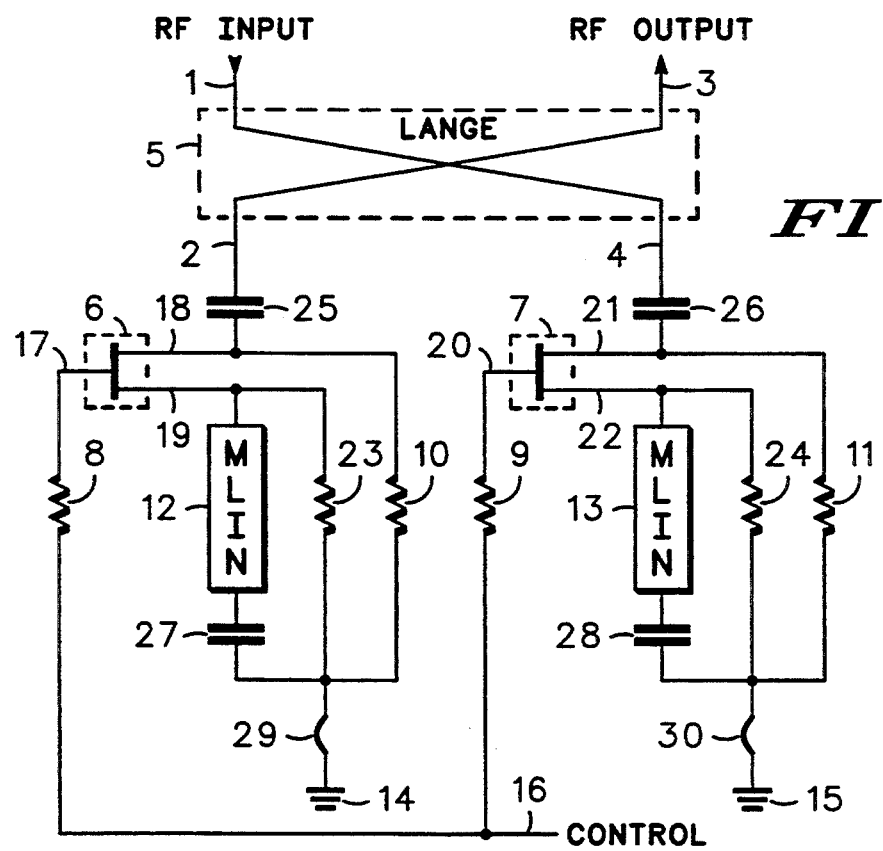
In FIG. 2, there is shown a schematic diagram of an example bi-phase modulator that was implemented; and In FIG. 3, there is shown the insertion loss performance of the Lange coupler utilized in the example bi-phase modulator referenced FIG. 2.

The functioning of the above-described preferred embodiment in accordance with the present invention may be better appreciated by an example. A bi-phase modulator was implemented using Monolithic Microwave Integrated Circuit (MMIC) technology for operation at approximately 5 GHz. The schematic representation of this example is illustrated in FIG. 2. First, like elements and functions in FIG. 2 are labeled with the same reference numbers as in FIG. 1. However, FIG. 2 shows some additional elements when compared with FIG. 1. FIG. 2 includes two pairs of bond wires 29 and 30 used to access ground 14 and 15 off of the chip. This was necessary since the particular MMIC wafer process that was selected for this design did not provide ground vias. Also added compared to FIG. 1 are coupling capacitors 25 and 26 that connect the drains 18 and 21 of the FETs 6 and 7 to the through ports 2 and 4, respectively, of the coupler 5. There are also bypass capacitors 27 and 28 located between the microstrip lines 12 and 13, and bond wires 29 and 30. The additional resistors 23 and 24 on the sources 19 and 22 of the FETs 6 and 7 were added in order to provide DC grounding. The additional elements and any degrees of freedom that they may provide for the implementation of this bi-phase modulator circuit, while used for the specific example disclosed herein, are not required.

In the implementation example of FIG. 2, the Lange coupler 5 was chosen because of its wider bandwidth capability than a ring hybrid or a branch line coupler. In addition to being one-quarter wavelength longer than the Lange coupler 5, a ring hybrid would also require inductors in the lumped element version, thus introducing more loss. Although smaller and more practical than its alternatives, a C Band (4.0–8.0 GHz) Lange coupler 5 is still relatively quite large. Typically, the coupler 5 is designed such that the coupling coefficient $k = 1/\sqrt{2}$, and the insertion losses through the two ports 2 and 4 are identical at $f_o$, the center frequency. Since such a design would be extremely long for an MMIC chip, the Lange coupler 5 was made significantly shorter by centering the response higher in frequency. The width of the coupler 5 transmission line and the gap between the lines was adjusted to provide overcoupling. When overcoupling occurs, the insertion losses are no longer identical through the two ports 2 and 4 of the coupler at $f_o$. Instead there are two regions, $f_o+f$ and $f_o-f$, where the losses are equal. By designing the coupler 5 with $k = \sqrt{\frac{2}{3}}$, it is half of its original length and still has balanced insertion loss at the desired frequency of operation $(f_o-f)$.

Figure 3:
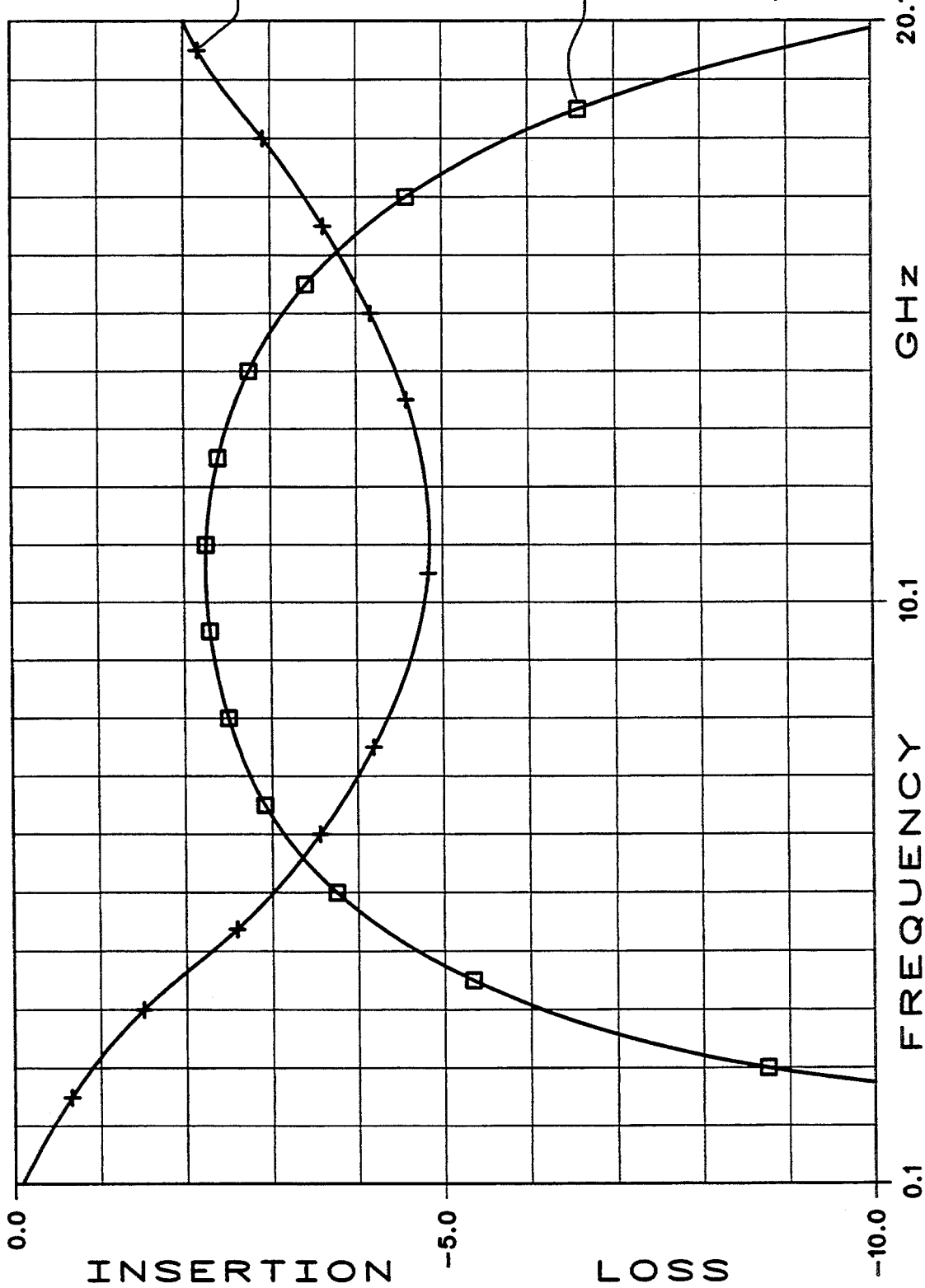

The frequency response of the Lange coupler 5 as used in this example is provided in FIG. 3. Although k now has a different value from that used in equations (2) through (5), equation (6) is still valid since it is a ratio of the two expressions of equation (5).

For this example, the FETs 6 and 7 were chosen to have 600 μm gate widths and 1.0 μm gate length. The drain resistors 10 and 11 used for amplitude balance were 900 ohms each. When simulating the loads on the Lange coupler 5 at the through ports 2 and 4, the following reflection coefficients were predicted:

|  | Reflection Coefficient | Magnitude | Angle |
|---|---|---|---|
| FET 2 on | .809 | 115 | degrees |
| FET 2 off | .862 | −63.9 | degrees |
| FET 4 on | .807 | 124.8 | degrees |
| FET 4 off | .860 | −65.4 | degrees |

Using these values in equation (6) for an ideal Lange coupler gives:

$$\frac{b_{3off}}{b_{3on}} = 1.06 \frac{\exp(-j64.5)}{\exp(j120.2)} = 1.06 \angle -184.7°$$

The computation above shows that, assuming the modeled loads used in this implementation example are used on an ideal Lange coupler, a bi-phase modulator with a 184.7 degrees phase difference and a 0.27 dB difference in insertion loss between the two states can be achievable. Since the Lange coupler 5 is not ideal, however, the reflection coefficients are purposely offset slightly in order to get the desired 180 degrees phase shift and 0 dB amplitude balance through the modulator.

Thus, as has been described, a no-matching approach to a bi-phase modulator overcomes specific problems and accomplishes certain advantages relative to prior art methods. This design approach does not require additional matching elements, such as inductors, to resonate out the parasitics of the FETs 6 and 7 since specific 0 and 180 degrees reflection coefficients at the drains 18 and 21 are not needed. As was shown by equation (6) from the transfer function matrix of a Lange coupler 5, the phase change through the coupler can be calculated by vector adding the reflection coefficients at the two through ports 2 and 4. This increases the ease of design and the lack of any additional matching elements provides improved performance with less loss and greater bandwidth. In addition, the circuit takes up less space on a MMIC wafer. Amplitude balance can be achieved by simply adjusting the drain bias resistors which are already inherent to the design. Finally, with so few elements necessary, there is less room for error in the simulation of the circuit and the bi-phase modulator's performance can be more accurately predicted.

Thus, there has also been provided a biphase modulator and method without matching elements that fully satisfies the aims and advantages set forth above. While this invention has been described in conjunction with a specific embodiment, many alternatives, modifications and variations will be apparent to those of ordinary skill in the art in light of the foregoing description. Examples of these include the use of FETs or PIN diodes in digital phase shifter applications as well as bi-phase modulators. Accordingly, the invention is intended to embrace all such alternatives, modifications, and variations as fall within the spirit and broad scope of the appended claims.

What is claimed is:

1. A biphase modulator without matching elements comprising:
    a Lange coupler including first, second, third, and fourth ports, wherein the first port is for receiving a RF input signal;
    a first FET having a source, gate, and drain, wherein the drain of the first FET is coupled to the second port and the source of the first FET is coupled to an electrical ground;
    a second FET having a source, gate, and drain, wherein the drain of the second FET is coupled to the fourth port and the source of the second FET is coupled to the electrical ground; and
    a control input, wherein the control input is provided to the gate of the first FET and to the gate of the second FET, the control input for alternately providing a zero volt signal and a pinch-off voltage signal such that an RF output signal is produced at the third port of the Lange coupler, the RF output signal comprising a biphase modulated RF input signal.

2. A biphase modulator as claimed in claim 1, further comprising a first gate bias resistor coupled to the gate of the first FET and a second gate bias resistor coupled to the gate of the second FET, wherein the control input is provided to the first gate bias resistor and the second gate bias resistor.

3. A biphase modulator as claimed in claim 2, further comprising a first drain resistor coupled between the drain of the first FET and the electrical ground and a second drain resistor coupled between the drain of the second FET and the electrical ground.

4. A biphase modulator as claimed in claim 1, further comprising first and second microstrip lines coupled between the source of the first FET and the electrical ground and the source of the second FET and the electrical ground, respectively, wherein the first and the second microstrip lines adjust biphase modulation of the RF output signal.

5. A biphase modulator as claimed in claim 1, further comprising a first coupling capacitor coupling the second port to the drain of the first FET and a second coupling capacitor coupling the fourth port to the drain of the second FET.

6. A biphase modulator as claimed in claim 5, further comprising a first bypass capacitor coupled between the first microstrip line and the electrical ground and a second bypass capacitor coupled between the second microstrip line and the electrical ground.

7. A biphase modulator as claimed in claim 6, further comprising a first bondwire coupled between the first bypass capacitor and the electrical ground and a second bondwire coupled between the second bypass capacitor and the electrical ground.

8. A biphase modulator as claimed in claim 7, further comprising a first DC grounding resistor coupled to the source of the first FET and across the first microstrip line and the first bypass capacitor and a second DC grounding resistor coupled to the source of the second FET and across the second microstrip line and the second bypass capacitor.

9. A method for biphase modulating a RF input signal without use of matching elements, the method comprising the steps of:
    receiving a RF input signal in a first port of a Lange coupler;
    alternately providing a control input comprising a zero volt signal and a pinch-off voltage signal to gates of first and second FETs such that the first and second FETs are switched on and off at a modulation frequency;
    coupling the drains of the first and second FETs to second and fourth ports of the Lange coupler, respectively; and
    an RF output signal comprising a biphase modulated RF input signal is produced at a third port of the Lange coupler.

10. A method for biphase modulating a RF input signal as claimed in claim 9, further comprising the steps of providing a first gate bias resistor coupled to the gate of the first FET and providing a second gate bias resistor coupled to the gate of the second FET such that the control input is provided to the first gate bias resistor and to the second gate bias resistor.

11. A method for biphase modulating a RF input signal as claimed in claim 10, further comprising the step of overcoupling the Lange coupler while maintaining balanced insertion loss at a desired frequency of operation.

12. A method for biphase modulating a RF input signal as claimed in claim 11, further comprising the steps of providing a first drain resistor between a drain of the first FET and an electrical ground and providing a second drain resistor between a drain of the second FET and the electrical ground to provide amplitude balance.

13. A method for biphase modulating a RF input signal as claimed in claim 12, further comprising the step of selecting a gate width and a gate length of both the first FET and the second FET such that there is a greater than 180 degree phase shift at the drain of the first FET and at the drain of the second FET.

14. A method for biphase modulating a RF input signal as claimed in claim 13, further comprising the step of adjusting the biphase modulated RF output signal using first and second microstrip lines between a source of the first FET and the electrical ground and a source of the second FET and the electrical ground, respectively.

15. A method for biphase modulating a RF input signal as claimed in claim 14, further comprising the steps of providing a first coupling capacitor between the second port and the drain of the first FET and a second coupling capacitor between the fourth port and the drain of the second FET.

16. A method for biphase modulating a RF input signal as claimed in claim 15, further comprising the steps of providing a first bypass capacitor between the first microstrip line and the electrical ground and providing a second bypass capacitor between the second microstrip line and the electrical ground.

17. A method for biphase modulating a RF input signal as claimed in claim 16, further comprising the steps of providing a first bondwire coupled between the first bypass capacitor and the electrical ground and providing a second bondwire coupled between the second bypass capacitor and the electrical ground.

18. A method for biphase modulating a RF input signal as claimed in claim 17, further comprising the steps of providing a first DC grounding resistor coupled to the source of the first FET and across the first microstrip line and the first bypass capacitor and providing a second DC grounding resistor coupled to the source of the second FET and across the second microstrip line and the second bypass capacitor.

* * * * *